United States Patent
Ono et al.

(10) Patent No.: US 11,852,968 B2
(45) Date of Patent: Dec. 26, 2023

(54) PELLICLE, EXPOSURE MASTER, EXPOSURE DEVICE AND METHOD FOR MANUFACTURING SEMICONDUCTOR DEVICE

(71) Applicant: MITSUI CHEMICALS, INC., Tokyo (JP)

(72) Inventors: Yosuke Ono, Sodegaura (JP); Kazuo Kohmura, Chiba (JP); Atsushi Okubo, Tokyo (JP); Daiki Taneichi, Chiba (JP); Hisako Ishikawa, Ichihara (JP); Tsuneaki Biyajima, Iwakuni (JP)

(73) Assignee: MITSUI CHEMICALS, INC., Tokyo (JP)

( * ) Notice: Subject to any disclaimer, the term of this patent is extended or adjusted under 35 U.S.C. 154(b) by 499 days.

(21) Appl. No.: 17/010,929

(22) Filed: Sep. 3, 2020

(65) Prior Publication Data
US 2020/0401039 A1 Dec. 24, 2020

Related U.S. Application Data

(63) Continuation of application No. PCT/JP2019/008189, filed on Mar. 1, 2019.

(30) Foreign Application Priority Data

Mar. 5, 2018 (JP) ................. 2018-038368

(51) Int. Cl.
*G03F 1/64* (2012.01)
*G03F 7/00* (2006.01)
(Continued)

(52) U.S. Cl.
CPC ............... *G03F 1/64* (2013.01); *G03F 1/62* (2013.01); *G03F 7/2004* (2013.01); *G03F 7/70983* (2013.01)

(58) Field of Classification Search
CPC ....................................... G03F 7/2004
See application file for complete search history.

(56) References Cited

U.S. PATENT DOCUMENTS 5,422,704 A 6/1995 Sego
6,627,365 B1 9/2003 Shiraishi
(Continued)

FOREIGN PATENT DOCUMENTS

EP 2267529 A1 * 12/2010 ............... G03F 1/64
EP 3 249 467 A1 11/2017
(Continued)

OTHER PUBLICATIONS

Cverna, Fran, ed. ASM ready reference: thermal properties of metals. Ch. 2 Thermal Expansion. Asm International. (Year: 2002).*

(Continued)

*Primary Examiner* — Christopher G Young
*Assistant Examiner* — Moriah S. Smoot
(74) *Attorney, Agent, or Firm* — BUCHANAN INGERSOLL & ROONEY PC

(57) ABSTRACT

To provide a pellicle in which outgas from an adhesive layer is suppressed. The pellicle includes a pellicle film, a support frame for supporting the pellicle film, a protrusion part arranged in the support frame, a first adhesive layer arranged on the protrusion part; and an inorganic material layer arranged at a position closer to the pellicle film than the first adhesive layer. The inorganic material layer may include a first inorganic material layer arranged at a first side surface of the first adhesive layer, the first side surface of the first adhesive layer intersecting the pellicle film, and arranged at a position closer to the pellicle film.

18 Claims, 17 Drawing Sheets

(51) Int. Cl.
G03F 1/62 (2012.01)
G03F 7/20 (2006.01)

(56) References Cited

U.S. PATENT DOCUMENTS

| | | | |
|---|---|---|---|
| 10,558,129 B2 | 2/2020 | Kruizinga et al. | |
| 2002/0089656 A1* | 7/2002 | Guo | G03F 7/70741 435/5 |
| 2002/0090558 A1* | 7/2002 | Shirasaki | G03F 7/70808 430/5 |
| 2003/0095245 A1* | 5/2003 | Mishiro | G03F 7/70983 355/75 |
| 2009/0246646 A1 | 10/2009 | Hamada | |
| 2010/0143829 A1 | 6/2010 | Mushell et al. | |
| 2011/0236807 A1 | 9/2011 | Shirasaki | |
| 2017/0184956 A1* | 6/2017 | Kohmura | H01L 21/027 |
| 2017/0184957 A1* | 6/2017 | Kohmura | G03F 7/2008 |
| 2018/0173092 A1* | 6/2018 | Lin | G03F 1/24 |

FOREIGN PATENT DOCUMENTS

| | | | | |
|---|---|---|---|---|
| EP | 3249467 A1 * | 11/2017 | | G03F 1/62 |
| JP | 05232690 A * | 9/1993 | | G03F 1/62 |
| JP | H05-232690 A | 9/1993 | | |
| JP | H05341502 A | 12/1993 | | |
| JP | H0619124 A | 1/1994 | | |
| JP | 07142562 A * | 6/1995 | | G03F 1/66 |
| JP | 2000292910 A * | 10/2000 | | G03F 1/84 |
| JP | 2003222990 A | 8/2003 | | |
| JP | 2009251022 A | 10/2009 | | |
| JP | 2011203568 A | 10/2011 | | |
| JP | 2017083791 A | 5/2017 | | |
| JP | 2017534077 A | 11/2017 | | |
| JP | 6275270 B2 * | 2/2018 | | G03F 1/62 |
| KR | 20100028040 A * | 10/2012 | | G03F 1/64 |
| WO | 9949366 A1 | 9/1999 | | |
| WO | 01/40870 A1 | 6/2001 | | |
| WO | WO-2015174412 A1 * | 11/2015 | | G03F 1/64 |
| WO | 2016043301 A1 | 3/2016 | | |
| WO | 2016/079051 A2 | 5/2016 | | |
| WO | WO-2018151056 A1 * | 8/2018 | | G03F 1/24 |

OTHER PUBLICATIONS

International Search Report (PCT/ISA/210) dated May 21, 2019, by the Japanese Patent Office as the International Searching Authority for International Application No. PCT/JP2019/008189.

Written Opinion (PCT/ISA/237) dated May 21, 2019, by the Japanese Patent Office as the International Searching Authority for International Application No. PCT/JP2019/008189.

Declaration filed in PCT/JP2019/008189 as to non-prejudicial disclosures or exceptions to lack of novelty (as filed with the PCT application under Rules 4.17(v) and 51bis. 1(a)(v)) in Japanese (1 page).

Ono, et al., "Development of EUV pellicle for suppression of contamination, haze and outgas generation", SPIE PhotomaskTechnology + EUV lithography 2017, Sep. 12, 2017 (16 pages).

Ono, et al., "Development of EUV pellicle for suppression of contamination, haze, and outgas generation", Proceedings of SPIE, Photomask Technology 10451, Citation identifiers (CIDs) 104510Q, Oct. 16, 2017 (10 pages).

* cited by examiner

PELLICLE, EXPOSURE MASTER, EXPOSURE DEVICE AND METHOD FOR MANUFACTURING SEMICONDUCTOR DEVICE

CROSS REFERENCE TO RELATED APPLICATIONS

This application is based upon and claims the benefit of priority from the prior Japanese Patent Application No. 2018-038368, filed on Mar. 5, 2018, and PCT Application No. PCT/JP2019/008189, filed on Mar. 1, 2019, the entire contents of which are incorporated herein by reference.

FIELD

The present invention relates to a photomask or a reticle (hereinafter referred to as "a photomask", "a mask" or "a master plate") used, for example, in manufacturing a semiconductor device by a lithography technique, and a pellicle which are a dust-proof cover for the photomask that prevents a dust from adhering to the photomask.

BACKGROUND

A semiconductor element is manufactured through a process called lithography. In lithography, an exposure device called a scanner or a stepper irradiates the mask on which a circuit pattern is drawn with an exposure light to transfer a circuit pattern to a semiconductor wafer on which a photoresist is applied. When a foreign matter such as a dust adheres to the mask, the shadow of the foreign matter is transferred to the semiconductor wafer, and the circuit pattern is not accurately transferred. As a result, the semiconductor element may not operate and become defective.

It is known to attach the pellicle containing a frame body to which a pellicle film is attached to the mask, thereby causing the foreign matter to adhere to the pellicle film and preventing the foreign matter from adhering to the mask. A focal point of the exposure light of the exposure device is set on the mask surface and the semiconductor wafer surface and not on the pellicle film surface. Therefore, the shadow of the foreign matter adhering to the pellicle film does not form an image on the semi-conductor wafer. Therefore, when the foreign matter adheres to the pellicle film, compared with when the foreign matter adheres to the mask, the degree at which the transfer of the circuit pattern is disturbed is reduced, and the incidence of defective in the semiconductor element is reduced.

And, a wavelength of the lithography advances in the shortening, and an extreme ultraviolet (Extreme Ultraviolet: EUV) optical lithography is being developed as a next generation lithography technology. The EUV light is a light having the wavelengths of a soft X-ray region or a vacuum-ultraviolet light region, and is the light having the wavelength of about 13.5 nm±0.3 nm. Since the EUV light has a shorter wavelength than ArF light or the like used in conventional lithography, it is known that the EUV light has a stronger energy.

Here, as a method of connecting the pellicle for an EUV exposure to the mask, mechanically fixing method with a pin called a stud installed on the mask and a holding spring attached to the pellicle via a fastener commonly arranged on the mask and the pellicle has been studied (Japanese laid-open patent publication No. 2017-534077). Japanese laid-open patent publication No. 2017-534077 discloses a configuration in which an adhesive is arranged on a concave part of the pellicle frame (FIG. 11, paragraphs [0266] to [0269]).

SUMMARY

However, when the inventors have studied, in the way of fixing using a spring and a stud, there was a case where a small dust is generated during detachment because of a mechanical connection. Further, when the adhesive is disposed on the concave part of the pellicle frame, the adhesive may protrude to increase the amount of outgas, and it may be required to suppress the generation of outgas.

In order to solve the above described problems, it is an object to provide the pellicle in which the outgas from an adhesive layer is suppressed.

In order to solve the above described problems, an embodiment according to the invention provides a pellicle. The pellicle comprises a pellicle film, a support frame for supporting the pellicle film, a protrusion part arranged in the support frame, a first adhesive layer arranged in the protrusion part, and an inorganic material layer arranged at a position closer to the pellicle film than the first adhesive layer.

In an embodiment according to the present invention, the inorganic material layer may comprise a first inorganic material layer arranged at a first side surface of the first adhesive layer, the first side surface of the first adhesive layer may be a side surface arranged along a direction intersecting the pellicle film, and the first side surface of the first adhesive layer may be arranged in a region where the pellicle film is located.

In an embodiment according to the present invention, the first inorganic material layer may be further arranged at a second surface of the first adhesive layer opposing the first surface.

In an embodiment according to the present invention, the first inorganic material layer may be further arranged at a first end surface of the first adhesive layer opposing a surface in contact with the protrusion part.

In an embodiment according to the present invention, a filling layer arranged in the support frame may be included, and the inorganic material layer may comprise a second inorganic material layer arranged at a third side surface of the filling layer, the third side surface of the filling layer may be a side surface arranged along a direction intersecting the pellicle film, and the third side surface of the filling layer may be arranged in a region where the pellicle film is located.

In an embodiment according to the present invention, the filling layer and the second inorganic material layer may be formed in a frame shape along a bottom surface of the support frame.

In an embodiment according to the present invention, the second inorganic material layer may be further arranged at a fourth side surface of the filling layer opposing the third side surface, and a second end surface of the filling layer opposing a surface in contact with the support frame.

In an embodiment according to the present invention, the support frame may comprise the first frame body connected with pellicle film, and a second frame body connected with the first frame body.

In an embodiment according to the present invention, the inorganic material layer may be a metal layer.

In an embodiment according to the present invention, the metal layer may be made from a metal selected from a group of aluminum, titanium, iron, nickel, copper, ruthenium, titanium and gold, or a compound including at least two elements selected from the group, or an oxide including at least one or more elements selected from the group.

In an embodiment according to the present invention, an exposure master plate may be provided. The exposure master plate may include a master plate, and the pellicle attached to a surface of the master plate with a pattern.

In an embodiment according to the present invention, an exposure device may be provided. The exposure device may comprise a light source for emitting an exposure light, the exposure master plate, and an optical system for guiding the exposure light emitted from the light source to the exposure master plate, and the exposure master plate may be arranged so that the exposure light emitted from the light source transmits a pellicle film and irradiates to the exposure master plate.

In an embodiment according to the present invention, the exposure light may be an EUV (Extreme Ultraviolet) light.

In an embodiment according to the present invention, a method of manufacturing a semiconductor device is provided. The method comprises transmitting an exposure light emitted from a light source through a pellicle film of the exposure master plate and irradiating the exposure light to the master plate and reflecting the exposure light on the master plate, and transmitting the exposure light reflected by the master plate through the pellicle film and irradiating the exposure light on a sensitive substrate, and thereby exposing the sensitive substrate in patterned shape.

REFERENCE SIGNS LIST

Figure 1:
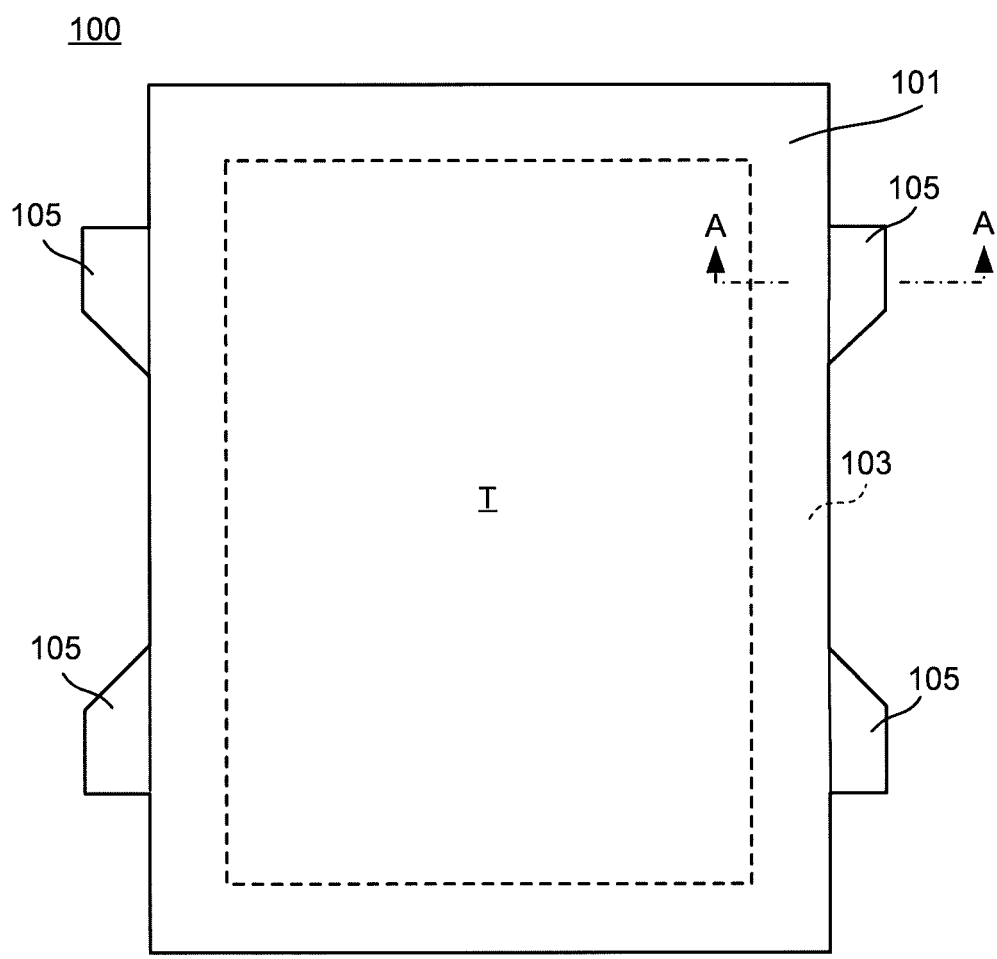
FIG. 1 is a top view of a pellicle according to an embodiment of the present invention.

100: pellicle, 101: pellicle film, 103: support frame, 103A: first frame body, 1032: bottom surface, 105: protrusion part, 105A: protrusion part, 107: first adhesive layer, 109: first inorganic layer, 111: filling layer, 113: second inorganic layer, 115: second frame body, 1152: bottom surface, 117: second adhesive layer, 121: first side surface, 131: second side surface, 141: first end surface, 1411: region, 1413: region, 1415: region, 1417: region, 1419: region, 151: third side surface, 161: fourth side surface, 171: second end surface, 180: exposure device, 181: exposure master plate, 182: light source, 183: lighting optical system, 184: master plate, 185: filter window, 186: filter window, 187: sensitive substrate, 188: projection optical system, 189: multilayer mirror, 190: multilayer mirror, 191: multilayer mirror, 200: mask

DESCRIPTION OF EMBODIMENTS

The embodiments of the present invention will be described below with references from FIGS. 1 to 22. However, the present invention can be implemented in many different aspects, and should not be construed as being limited to the description of the following embodiments. In addition, although the drawings may schematically represent the width, thickness, and shape and the like of each part as compared with actual aspects to clarify the description, the drawings are merely an example and do not limit the interpretation of the present invention. In this specification and each drawing, the same reference numerals are assigned to the same elements as those described above with the reference to the preceding drawings, and detailed description thereof may be omitted as appropriate.

In this specification, when a member or a region is "above (or below)" another member or region, unless otherwise limited, this includes not only being directly above (or below) another member or region, but also being over (or under) another member or region, including a case where another component is included above (or below) another member or region and between the member or region and another member or region.

EMBODIMENTS

FIG. 1 is a top view of a pellicle 100 according to an embodiment of the present invention. The pellicle 100 is a pellicle for an EUV photolithography. The pellicle film for the EUV photolithography is not particularly limited. The pellicle 100 includes a pellicle film 101, a support frame 103, and four protrusion parts 105.

The pellicle film 101 is a thin film used for the pellicle 100. The Pellicle film 101 is, for example, SiN, a carbon-based film (for example, a graphene film, a carbon nanotube film, and a carbon nanosheet), a polysilicon, or a stacked structure in which a plurality of these layers is stacked. The pellicle film 101 is rectangular in top surface here, but may also be square or other shapes.

The pellicle film 101 is, for example, formed on a substrate by CVD method (Chemical Vapor Deposition) or a sputter deposition method. The substrate is, for example, a silicon wafer, a sapphire, or a silicon carbide. The CVD method is, for example, a film formation method using LP-CVD or PE-CVD. Thereafter, substrate is etched (more specifically, back-etched) so that the pellicle film 101 is exposed, whereby the pellicle film 101 is manufactured. The back-etching is a step of removing a part of substrate while leaving the pellicle film 101.

The support frame 103 is a frame body that supports the pellicle film 101. The support frame 103 supports the pellicle film 101 from one surface of the pellicle film 101. The support frame 103 has a shape corresponding to the shape of the pellicle film 101. The support frame 103 is a rectangular frame body along an outer edge of the pellicle film 101 here, but may also be a frame body having a square shape or other shapes.

The support frame 103 may be the frame body that remains by etching while leaving substrate in the frame shape, or may be another frame body. The method in which the pellicle film 101 is fixed to the support frame 103 is not particularly limited. For example, the pellicle film 101 may be attached directly to the support frame 103. The Pellicle film 101 may be adhered to the support frame 103 via a membrane adhesive layer on one end surface of the support frame 103. The pellicle film 101 may be mechanically or magnetically fixed to the support frame 103.

Each of the four protrusion parts 105 is a region which protrudes from the support frame 103. Specifically, each of the four protrusion parts 105 protrudes from the support frame 103 in a top view toward the side opposed to the side on which pellicle film 101 is located. Of the four protrusion parts 105, the two protrusion parts 105 are arranged along one side of the support frame 103, the remaining two protrusion parts 105 are arranged along the side that is facing to the one side of the support frame 103.

Each of the four protrusion parts 105 is integrally formed with the support frame 103. However, at least a part of the four protrusion parts 105 may be formed of a member different from the support frame 103, for example, may be connected to the support frame 103 by adhesion. In the present embodiment, it is assumed that the four protrusion parts 105 are the same shape and the same dimension. At least one of the four protrusion parts 105 may differ in shape or dimension from the other protrusion parts 105.

Figure 2:
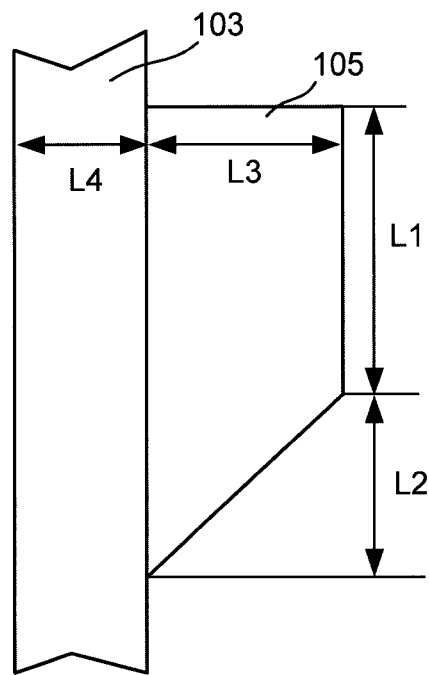
FIG. 2 is a diagram illustrating a configuration of a protrusion part according to an embodiment of the present invention.

FIG. 2 is a diagram for explaining the configuration of the protrusion part 105. FIG. 2 is a top view of the protrusion part 105 and its surrounding parts in the pellicle 100. The protrusion part 105 has a trapezoidal shape in the top view. Specifically, the protrusion part 105 has an upper bottom shorter than a lower bottom, and the lower bottom contacts the support frame 103. The area of the protrusion part 105 is, for example, 30 mm$^2$ or more 250 mm$^2$ or less. The length L1 of the part corresponding to the upper bottom of the protrusion part 105 is, for example, 15 mm. The length L1+L2 of the part corresponding to the lower bottom of the protrusion part 105 is, for example, 25 mm, that is, L2=10 mm. The length L3 of the part corresponding to the height of the protrusion part 105 is, for example, 10 mm. The width L4 of the support frame 103 is, for example, 2 mm or more and 4 mm or less.

The pellicle 100 and the photomask (a mask (master plate) 200, which will be described later) are connected using the adhesive. In the EUV optical lithography, since the exposure is performed under vacuum, it is sometimes required to suppress the generation of outgas from the adhesives. In order to solve this problem, there is a technique of irradiating one surface of the adhesive with the EUV light prior to use of the pellicle, generating gas in advance, and reducing the amount of the outgas generated during the use of the pellicle. However, in this method, it is sometimes required to suppress the generation of the dust derived from the adhesive which is damaged by the EUV light and becomes brittle by losing flexibility. Similarly, in a means for reducing outgas by such as prebaking, it is sometimes required to suppress the generation of the dust. The pellicle 100 has, for example, the following configuration examples as a configuration for suppressing the outgas from the adhesive layer and ensuring good adhesion of the pellicle frame.

Configuration Example 1

Figure 3:
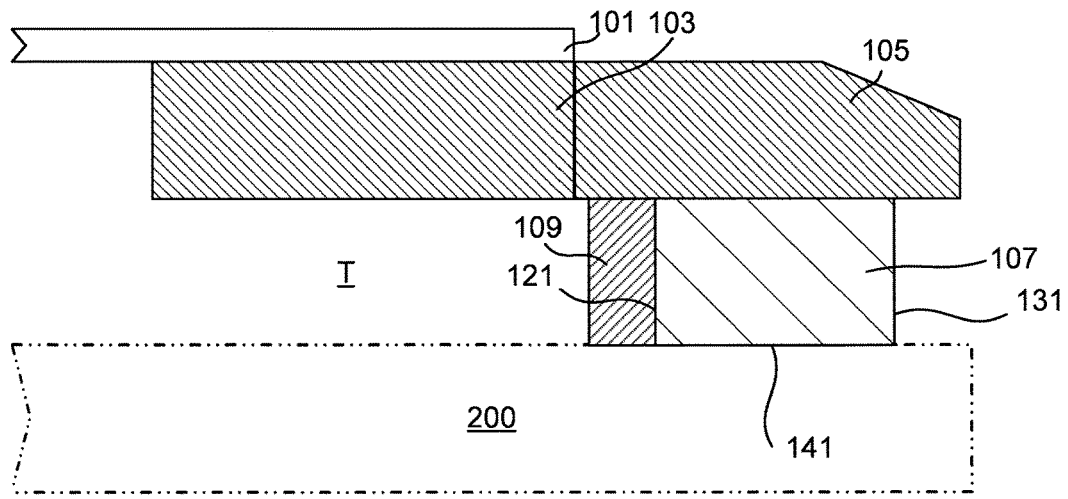
FIG. 3 is a cross-sectional view of a pellicle according to a configuration example 1 of an embodiment of the present invention.
Figure 4:
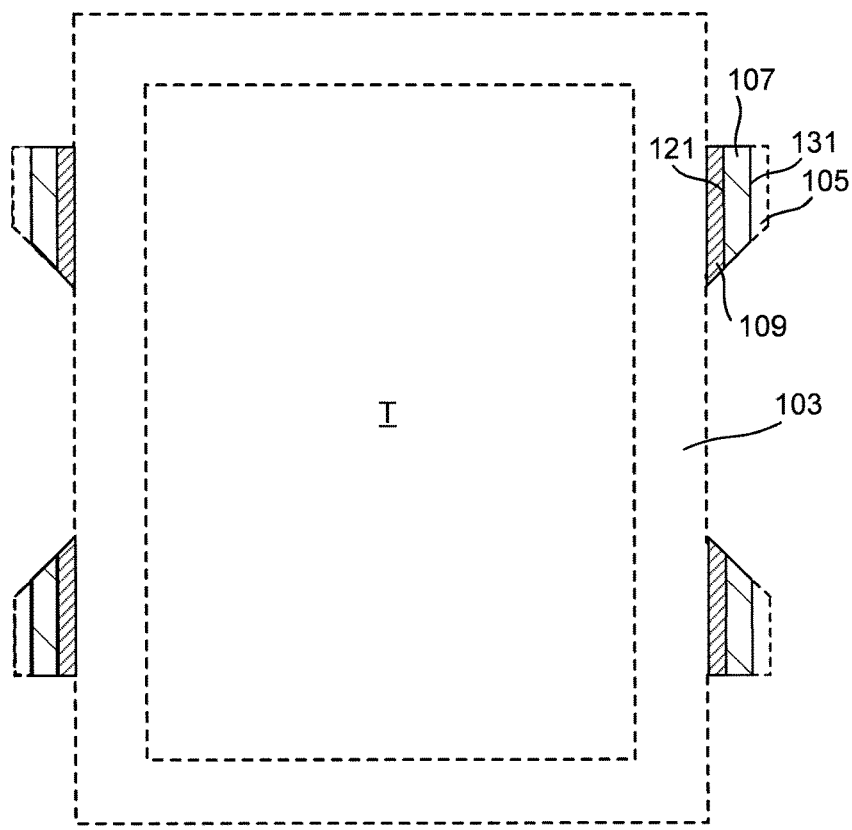
FIG. 4 is a view from below of a pellicle according to a configuration example 1 of an embodiment of the present invention.

FIG. 3 is a cross-sectional view of the pellicle 100 cut along a plane view including the pellicle film 101, the support frame 103, and the protrusion part 105 (i.e., A-A cross-sectional view of FIG. 1). FIG. 4 is a view of the pellicle 100 of the configuration of FIG. 3 from below (i.e., viewed from a direction perpendicular to a first end surface 141 to be described later). In FIG. 4, the support frame 103 and the protrusion part 105 are indicated by broken lines, and the pellicle film 101 is omitted. In the present embodiment, it is assumed that the configurations around the four protrusion parts 105 are identical to each other. This assumption is the same for each example configuration described below.

The support frame 103 is connected to the mask 200 via the protrusion part 105 and the first adhesive layer 107. The first adhesive layer 107 is a layer including the adhesive. The first adhesive layer 107 is the adhesive layer for arranging the pellicle 100 on the mask 200. Specifically, the first adhesive layer 107 contacts the protrusion part 105 and connects to the protrusion part 105 and the mask 200. The first adhesive layer 107, for example, does not contact the support frame 103. The interface between the support frame 103 and the protrusion part 105 and the end surface on which the first adhesive layer 107 of the protrusion part 105 is arranged intersect each other.

The adhesive of the first adhesive layer 107 is, for example, an acrylic resin adhesive, an epoxy resin adhesive, a polyimide resin adhesive, a silicone resin adhesive, an inorganic-based adhesive, a double-sided tackiness agent, a silicone resin tackiness agent, an acrylic tackiness agent, or a polyolefin-based tackiness agent, but may be the adhesive other than these. In the present specification, the adhesive included in the first adhesive layer 107 is not only the adhesive but also the tackiness agent.

The first adhesive layer 107 includes a first surface 121, a second surface 131, and a first end surface 141. The first surface 121 is a side surface arranged along a direction that intersects the pellicle film 101 (more specifically, the film surface of the pellicle film 101) and is a side surface in a region where the pellicle film 101 is located. Further, "a region where the pellicle film 101 is located" refers to the region where the center of the pellicle film is located in horizontal direction with respect to the pellicle. The second surface 131 is a side surface opposed to the first surface 121 and is substantially parallel to the first surface 121. In other words, the second surface 131 is a side surface arranged along a direction that intersects the pellicle film 101 and is a side surface at the opposite side to an region where the pellicle film 101 is located. The first end surface 141 is an end surface opposed to the surface on which the first adhesive layer 107 contacts the protrusion part 105. The first end surface 141 is located between the first surface 121 and the second surface 131, and is an end surface which connects the first surface 121 and the second surface 131 without contacting the protrusion part 105. The shape of the first end surface 141 of the first adhesive layer 107 is not limited, but may include, for example, rectangular, trapezoidal, circular, indefinite, or other shapes.

In this specification, each side surface and each end surface are plane, but each part or all regions may include a region of curved surface. Each side surface is not limited to the plane perpendicular to the surface of the pellicle film 101 or the mask 200, and may be the plane inclined with respect to the surface of the pellicle film 101 or the mask 200.

A first inorganic material layer 109 is arranged closer to the pellicle film 101 than the first adhesive layer 107. Specifically, the first inorganic material layer 109 is arranged on the first surface 121. The first inorganic material layer 109 covers, for example, the entire first surface 121. The first inorganic material layer 109 contacts at least the protrusion part 105. The first inorganic material layer 109 contacts, for example, the protrusion part 105, but not the support frame 103. The first inorganic material layer 109 is formed of a material having a low transmittance of the EUV light (e.g., metallic or ceramic). The EUV light has the wavelength of 5 nm or more and 30 nm or less. The wavelength of the EUV light is preferably greater than or equal to 5 nm and less than or equal to 14 nm.

The first inorganic material layer 109 prevents the outgas generated from the first surface 121 from entering a region T sandwiched between the mask 200 and the pellicle film 101. This suppresses the occurrence of contamination on the surface of the mask 200. The thickness of the first adhesive layer 107 is preferably 10 µm or more and 1 mm or less. Here, the thickness of the first adhesive layer 107 refers to the length of the first adhesive layer 107 in a direction perpendicular to the film surface of the pellicle film 101. For example, when the thickness of the first adhesive layer 107 is 10 µm or more, the adhesion between the protrusion part 105 and the mask 200 can be easily ensured. When the thickness of the first adhesive layer 107 is 1 mm or less, the generation of the outgas tends to be suppressed.

The first inorganic material layer 109 is preferably less degraded by the EUV light and has an EUV light transmittance of 10% or less. As a result, the quantity of the outgas generated from the first adhesive layer 107 is reduced. Further, it is preferable that the first inorganic material layer 109 has resistance to hydrogen radicals. The thickness of the first inorganic material layer 109 is preferably about 50 nm or more and 1 µm or less. Here, the thickness of the first inorganic material layer 109 means the length of the first inorganic material layer 109 in a direction parallel to the film surface of the pellicle film 101.

The transmittance of the EUV light of 10% or less means that the EUV light having the wavelength of 13.5 nm is irradiated and the transmittance of the EUV light is 10% or less when the thickness of a predetermined inorganic material layer is 400 nm.

The method of coating the first inorganic material layer 109 onto the first adhesive layer 107, for example include, but is not limited to, a vapor deposition or a sputtering. It may be a method in which first inorganic material layer 109 can be formed on the first adhesive layer 107.

In the process of installing the pellicle 100 on the mask 200, a force in the installation direction may be applied to the first adhesive layer 107, and the force (shear) in a direction crossing the installation direction may act on the first adhesive layer 107 in the exposure device. To solve this problem, the first inorganic material layer 109 is preferably formed of a metal layer in order to keep pace with changes in the geometry of the first adhesive layer 107.

The metal that can be applied to the first inorganic material layer 109 preferably include, for example, any one selected from the group of Al (aluminum), Ti (titanium), V (vanadium), Cr (chromium), Mn (manganese), Fe (iron), Co (cobalt), Ni (nickel), Cu (copper), Zn (zinc), Ga (gallium), Ge (germanium), Sr (strontium), Y (yttrium), Zr (zirconia), Nb (niobium), Mo (molybdenum), Ru (ruthenium), Rh (rhodium), Pd (palladium), Ag (silver), Hf (hafnium), Ta (tantalum), W (tungsten), Pt (platinum), and Au (gold). The first inorganic material layer 109 may be an alloy or an oxide using two or more elements selected from these.

Among the above metals, any one of metals selected from the group consisting of Al (aluminum), Ti (titanium), Cr (chromium), Fe (iron), Ni (nickel), Cu (copper), Ru (ruthenium), Ta (tantalum), and Au (gold) is more preferable as a metal applicable to the first inorganic material layer 109.

The first inorganic material layer 109 may be an alloy or an oxide using two or more elements selected from among Al (aluminum), Ti (titanium), Cr (chromium), Fe (iron), Ni (nickel), Cu (copper), Ru (ruthenium), Ta (tantalum) and Au (gold).

An interlayer may be arranged between the first adhesive layer 107 and the first inorganic material layer 109. The interlayer contributes to preventing cracking of the first inorganic material layer 109. Since the first inorganic material layer 109 is stacked on the interlayer, there is no limit on the transmittance of the EUV light and the physical properties of the outgas. An interlayer is formed, for example, by vapor deposition, sputtering, or CVD using the material such as parylene, polyimide, ceramic, or metal material.

A protective layer may be arranged on the first end surface 141 of the first adhesive layer 107. A known material such as a release liner, also called as a release film or a separator, may be applied as the protective layer without particular limitation. The protective layer contributes to suppressing a decrease in the tack strength of the first adhesive layer 107 at the time of conveyance.

Figure 5:
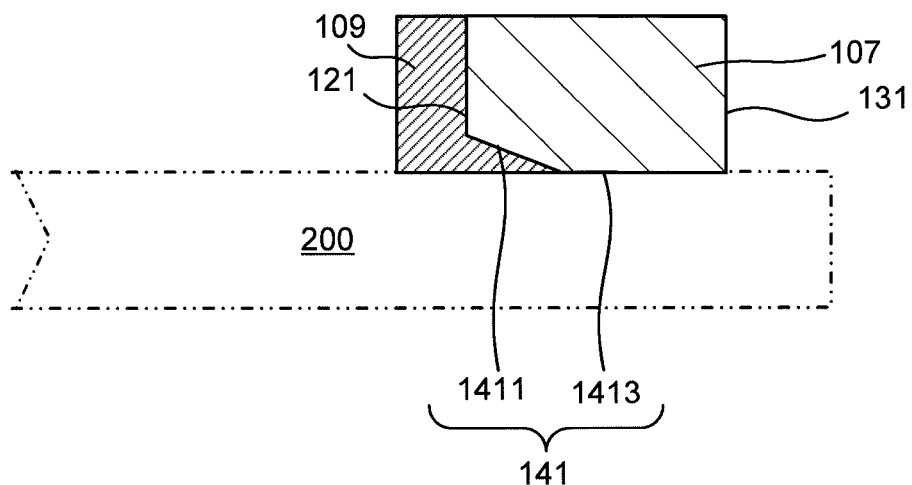
FIG. 5 is a diagram showing another example of a configuration of a first adhesive layer and a first inorganic material layer according to a configuration example 1 of an embodiment of the present invention.

FIG. 5 is a diagram showing another exemplary configuration of the first adhesive layer 107 and the first inorganic material layer 109. In this example, the first inorganic material layer 109 contacts the region of a part of the first end surface 141 in addition to the first surface 121. Specifically, the first inorganic material layer 109 contacts a region 1411 of the first end surface 141 that adjoins the first side surface 121. A region 1413 of the first end surface 141 adjoining the region 1411 contacts the surfaces of the mask 200. The thickness of the first inorganic material layer 109 in a direction perpendicular to the film surface of the pellicle film 101 decreases as it approaches the region 1413. The method of forming the first inorganic material layer 109 is, for example, coating an inorganic material by magnetron sputtering while protecting the region 1413 of the first adhesive layer 107 with a masking tape, and then peeling off the masking tape.

The pellicle 100 according to the configuration example 1, since the support frame 103 is adhesive to the mask 200 through the first adhesive layer 107, the generation of the dust is suppressed as compared with when the physical connection using the stud is employed. Further, since the first inorganic material layer 109 covers the first surface 121, the outgas from the first adhesive layer 107 is hardly generated. Further, the first adhesive layer 107 is arranged on the protrusion part 105 protruding from the support frame 103. Therefore, since the first adhesive layer 107 gets away from the EUV irradiating part as compared with the case where the first adhesive layer 107 is arranged in the support frame 103, the thermal degradation caused by the EUV light is reduced.

Configuration Example 2

Figure 6:
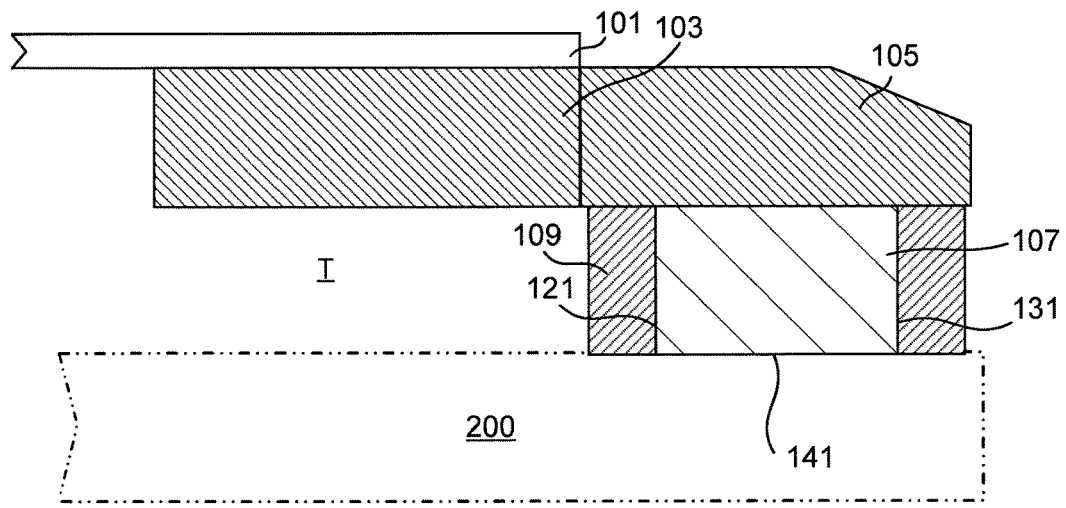
FIG. 6 is a cross-sectional view of a pellicle according to a configuration example 2 of an embodiment of the present invention.
Figure 7:
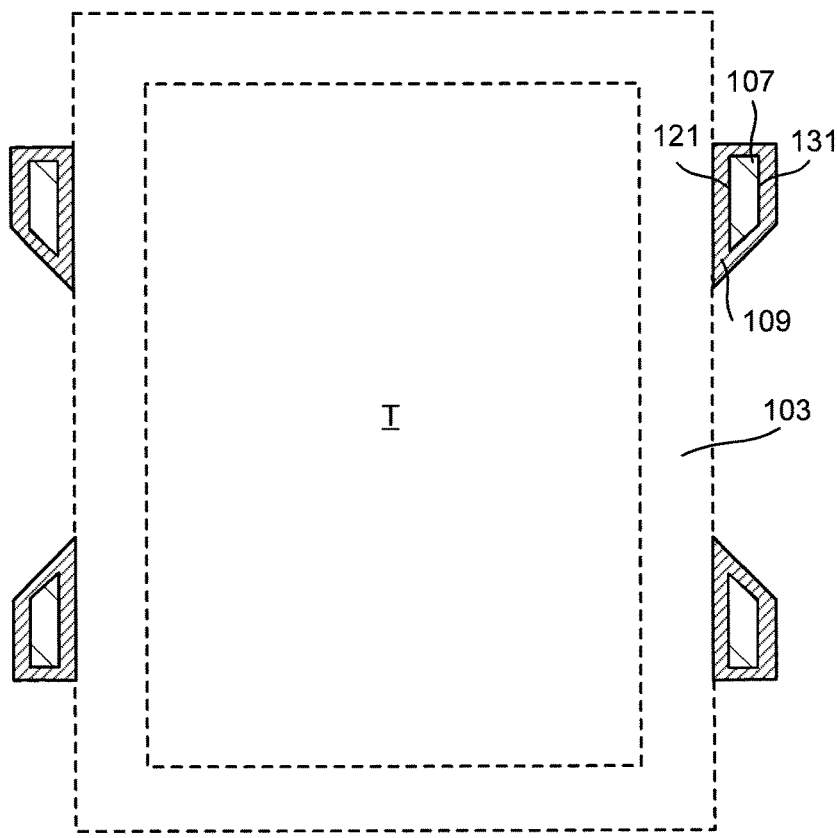
FIG. 7 is a view from below of a pellicle according to a configuration example 2 of an embodiment of the present invention.

FIG. 6 is a cross-sectional view of the pellicle 100 cut along a plane including the pellicle film 101, the support frame 103, and the protrusion part 105 (i.e., A-A cross-sectional view of FIG. 1). FIG. 7 is a view of the pellicle 100 of the configuration of FIG. 6 viewed from below. In FIG. 7, the support frame 103 and the protrusion part 105 are indicated by broken lines, and the pellicle film 101 is omitted. In the configuration example 2, the first inorganic material layer 109 is arranged in the first surface 121 and the second surface 131 of the first adhesive layer 107. The first inorganic material layer 109 is, for example, arranged on the entire surface of the first adhesive layer 107. The first inorganic material layer 109 contacts, for example, the protrusion part 105, but not the support frame 103.

Figure 8:
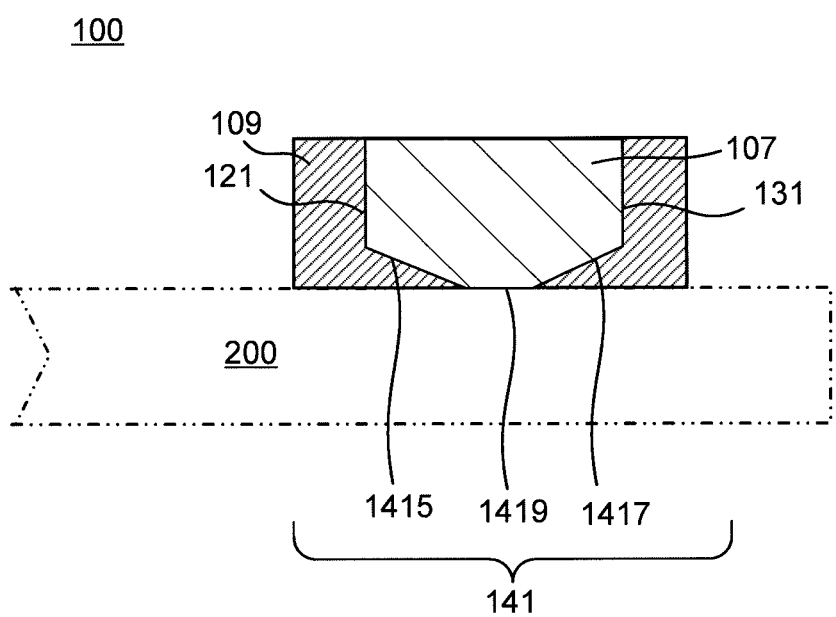
FIG. 8 is a diagram showing another example of a configuration of a first adhesive layer and a first inorganic material layer according to a configuration example 2 of an embodiment of the present invention.

FIG. 8 is a diagram showing another exemplary configuration of the first adhesive layer 107 and the first inorganic material layer 109. In this example, the first inorganic material layer 109 contacts a part of the region of the first end surface 141 in addition to the first surface 121 and the second surface 131. Specifically, the first inorganic material layer 109 contacts a region 1415 of the first end surface 141 which adjoins to the first surface 121 and the region 1417 which adjoins to the second surface 131. A region 1419 is a region located between the region 1415 and the region 1417 of the first end surface 141 and adjoining the region 1415 and the region 1417, and contacts the surface of the mask 200. The thickness of the first inorganic material layer 109 in a direction perpendicular to the film surface of the pellicle film 101 decreases as it approaches the region 1419. The method of forming the first inorganic material layer 109 is, for example, coating the inorganic material by magnetron sputtering while protecting the region 1419 of the first adhesive layer 107 with the masking tape, and then peeling off the masking tape.

The pellicle 100 according to the configuration example 2, since the first inorganic material layer 109 covers the second surface 131, the outgas is less likely to occur from the first adhesive layer 107. In addition, the pellicle 100 according to the configuration example 2 exhibits an effect equivalent to that of the pellicle 100 according to the configuration example 1.

Configuration Example 3

Figure 9:
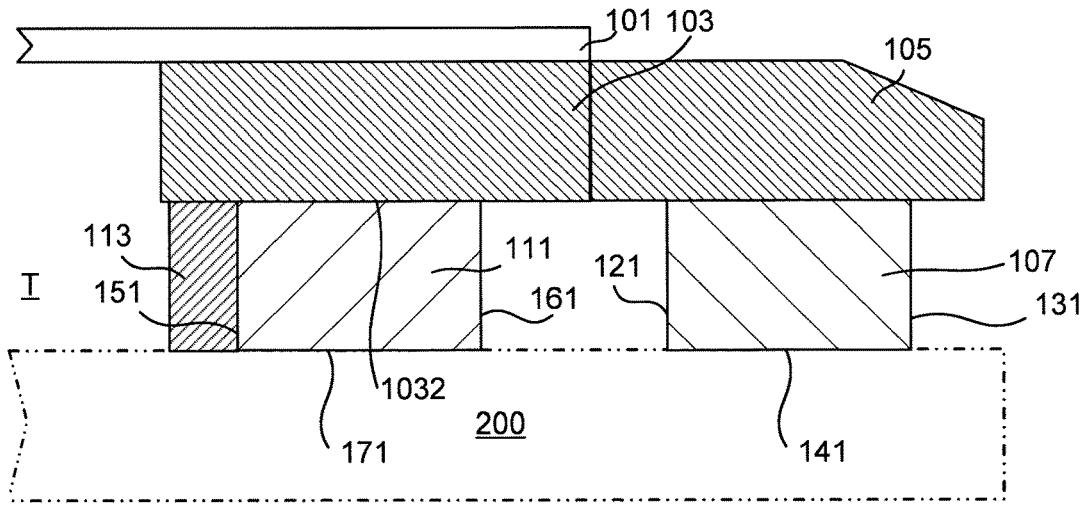
FIG. 9 is a cross-sectional view of a pellicle according to a configuration example 3 of an embodiment of the present invention.

FIG. 9 is a cross-sectional view of the pellicle 100 cut along a plane view including the pellicle film 101, the support frame 103, and the protrusion part 105 (i.e., A-A cross-sectional view of FIG. 1).

In the configuration example 3, the first inorganic material layer 109 is not arranged on the first adhesive layer 107 of the pellicle 100. That is, the first surface 121 and the second surface 131 of the first adhesive layer 107 are exposed to the outside.

In the configuration example 3, the pellicle 100 includes a filling layer 111 and a second inorganic material layer 113. The filling layers 111 improve the adhesion between the support frame 103 and the mask 200. The filling layer 111 is arranged on an region closer to the pellicle film 101 than the first adhesive layer 107. Specifically, the filling layer 111 is arranged on the support frame 103 and connects the support frame 103 and the mask 200. The filling layer 111 contacts at least the support frame 103. The filling layer 111 contacts, for example, the support frame 103, but does not contact the protrusion part 105. The interface between the support frame 103 and the protrusion part 105 and the end surface where the filling layer 111 of the support frame 103 is arranged intersect each other.

The filling layer 111 includes a third side surface 151, a fourth side surface 161, and a second end surface 171. The third side surface 151 is a side surface arranged on a direction crossing the pellicle film 101 and is side surface on the region on which the pellicle film 101 is located. The third side surface 151 is a side surface on a region for forming the region T between the mask 200 and the pellicle film 101. The fourth side surface 161 is a side surface opposite to the third surface 151 and substantially parallel to the third surface 151. That is, the fourth side surface 161 is a side surface arranged on a direction crossing the pellicle film 101 and is a side surface on a region opposite to the region on which the pellicle film 101 is located. The second end surface 171 is an end surface opposite to a surface on which the filling layer 111 contacts with the support frame 103. The second end surface 171 is an end surface located between the third side surface 151 and the fourth side surface 161 and is connected to the third side surface 151 and the fourth side surface 161 without contacting the support frame 103.

Here, the filling layer 111 is formed using an organic material. The organic material is, for example, nitrile rubber, fluoro-rubber, ethylene propylene rubber, chloroprene rubber, hydrogenated nitrile rubber, perfluoroelastomer, tetrafluoroethylene-propylene-based fluoro-rubber, silicone rubber, fluorosilicone rubber, butyl rubber, acrylic rubber, styrene butadiene rubber, chlorosulfonated polyethylene, urethane rubber, olefinic elastomer, styrene elastomer, or amide elastomer. In order to improve the adhesion (contact width) between the filling layers 111 and the mask 200 with less force, the elastic modulus of the organic materials is preferably within a predetermined range of 0.1 MPa or more and 100 MPa or less at a temperature of 20° C.

The second inorganic material layer 113 is an inorganic material layer arranged at a position closer to the pellicle film 101 than the filling layer 111. Specifically, the second inorganic material layer 113 is arranged in the third side surface 151. The second inorganic material layer 113 covers, for example, the entirety of the third side surface 151. The second inorganic material layer 113 contacts at least the support frame 103. The second inorganic material layer 113 contacts, for example, the support frame 103, but not the protrusion part 105. The second inorganic material layer 113 may be formed of the same material as the first inorganic material layer 109, or may be formed of a different material.

Figure 10:
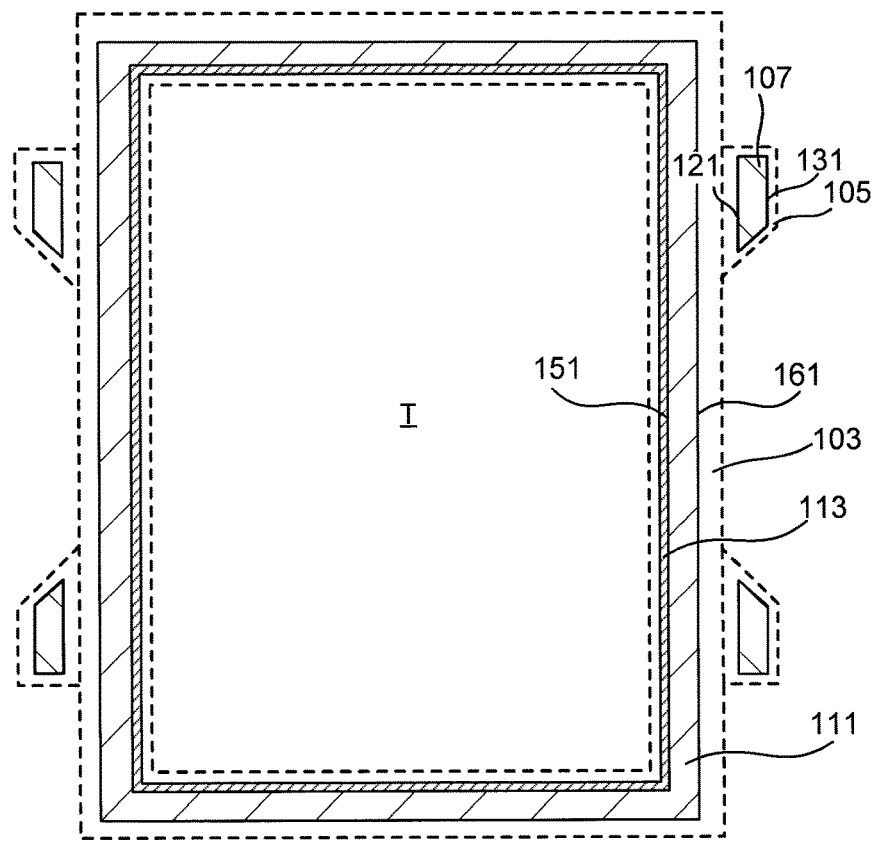
FIG. 10 is a view from below of a pellicle according to a configuration example 3 of an embodiment of the present invention.

FIG. 10 is a view from below of the pellicle 100 of the configuration of FIG. 9. In FIG. 10, the support frame 103 and the protrusion part 105 are indicated by broken lines, and the pellicle film 101 is omitted. The filling layers 111 and the second inorganic material layer 113 have a shape corresponding to the shape of the support frame 103. That is, the filling layers 111 and the second inorganic material layer 113 are formed in a rectangular frame shape here. The filling layers 111 and the second inorganic material layer 113 are formed in a frame body shape along a bottom surface 1032 of the support frame 103. The bottom surface 1032 is an end surface facing the mask 200 of the support frame 103. In other words, the filling layers 111 and the second inorganic material layer 113 are continuously arranged along the circumference of the support frame 103. The second inorganic material layer 113 covers the entire third side surface 151 of the filling layer 111. When the pellicle 100 is viewed from the mask 200 side, the support frame 103, the filling layer 111, and the second inorganic material layer 113 surround the region T. Thus, the region T becomes a closed region closed by the pellicle film 101, the mask 200, the filling layer 111, and the second inorganic material layer 113.

The pellicle 100 according to the configuration example 3, since the support frame 103 is connected to the mask 200 by using the first adhesive layer 107 and the filling layer 111, the generation of the dust can be suppressed, and the adhesion between the pellicle 100 and the mask 200 can be improved. In addition, since the region T is closed region, the dust and the outgas do not easily enter the region T. The second inorganic material layer 113 covers the third side surface 151 of the filling layer 111. Further, the first adhesive layer 107 is arranged at a position further from the pellicle film 101 than the second inorganic material layer 113 and the filling layer 111. Therefore, the pellicle 100 is less likely to generate the outgas, and is less likely to deteriorate due to the heat caused the by EUV light.

Configuration Example 4

Figure 11:
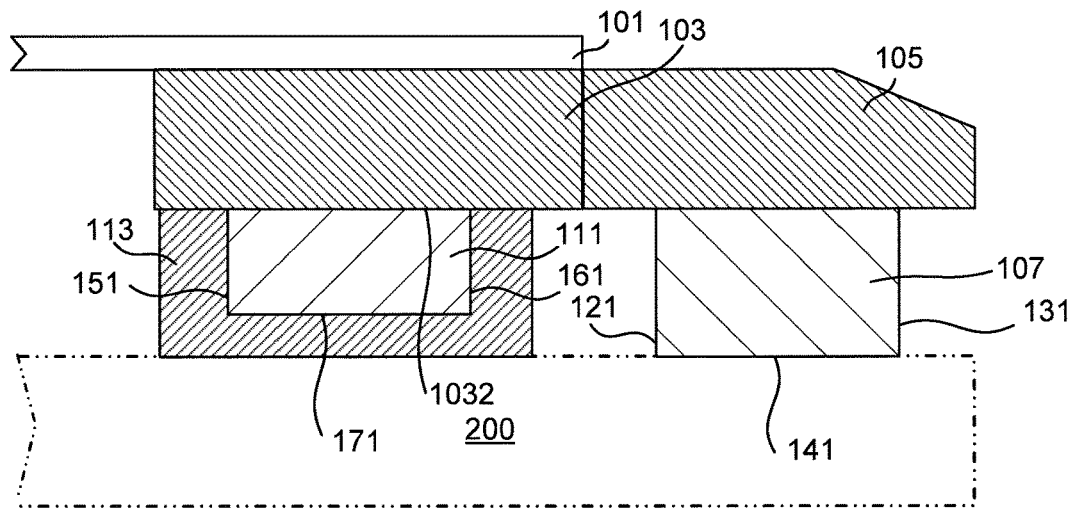
FIG. 11 is a cross-sectional view of a pellicle according to a configuration example 4 of an embodiment of the present invention.

FIG. 11 is a cross-sectional view of the pellicle 100 cut along a plane including the pellicle film 101, the support frame 103, and the protrusion part 105 (i.e., A-A cross-sectional view of FIG. 1). In the configuration example 4, the second inorganic material layer 113 is arranged in the third side surface 151, the fourth side surface 161, and the second end surface 171. The second inorganic material layer 113 covers, for example, the entire side surfaces of the filling layer 111 and the entire second end surface 171. The second inorganic material layer 113 contacts at least the support frame 103. The second inorganic material layer 113 contacts, for example, the support frame 103, but not the protrusion part 105.

Figure 12:
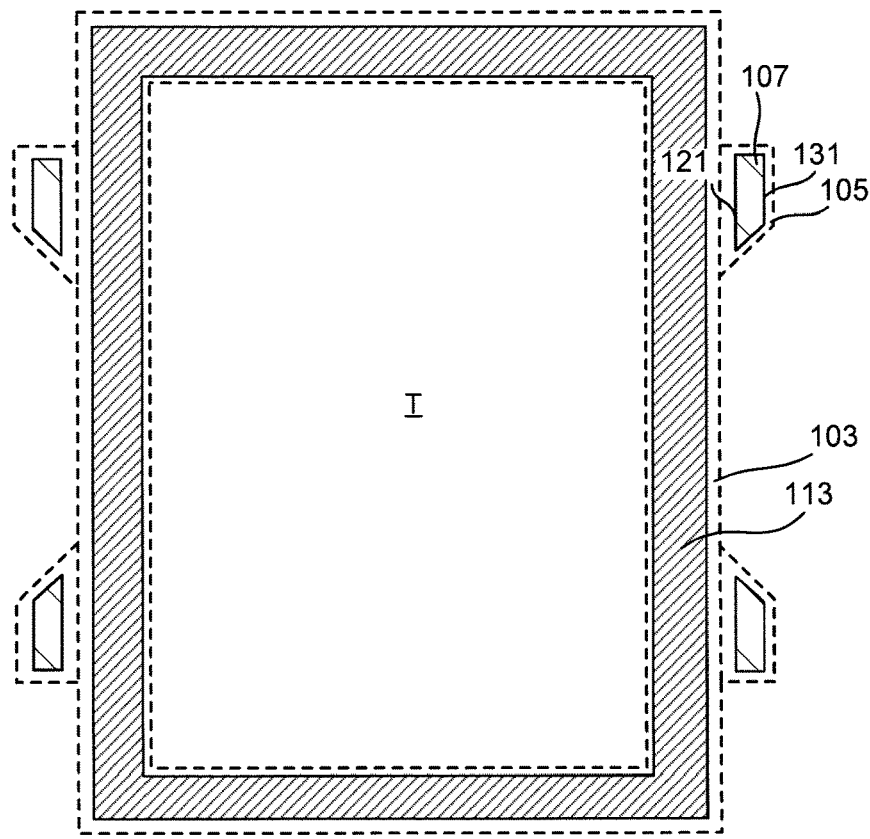
FIG. 12 is a view from below of a pellicle according to a configuration example 4 of an embodiment of the present invention.

FIG. 12 is a view from below of the pellicle 100 of the configuration of FIG. 11. In FIG. 12, the support frame 103 and the protrusion part 105 are indicated by broken lines, and the pellicle film 101 is omitted. The filling layer 111 and the second inorganic material layer 113 have a shape corresponding to the shape of the support frame 103. That is, the second inorganic material layer 113 is formed in a frame shape along the bottom surface 1032 of the support frame 103. In other words, the second inorganic material layer 113 is continuously arranged along the circumference of the support frame 103. The second inorganic material layer 113 entirely covers the third side surface 151, the fourth side surface 161, and the second end surface 171 of the filling layer 111. When the pellicle 100 is viewed from the mask 200 side, the second inorganic material layer 113 surrounds the region T. Thus, the region T is a closed region closed by the filling layers 111 and the second inorganic material layer 113.

In the configuration example 4, the second inorganic material layer 113 covers the second end surface 171 connecting the filling layers 111 and the mask 200. Even if the second inorganic material layer 113 is formed, since the elastic modulus of the filling layer 111 is included in the above-mentioned predetermined ranges, the filling layer 111 adheres to the mask 200 through the second inorganic material layer 113, and the penetration of the dust into the region T is suppressed. From the viewpoint of further improving the adhesion between the filling layers 111 and the mask 200, the thickness of the second inorganic material layer 113 formed on the second end surface 171 is preferably 10 μm or less, and more preferably 1 μm or less. From the viewpoint of preventing cracks from occurring, the thickness of the second inorganic material layer 113 is preferably 50 nm or more, and more preferably 100 nm or more.

Configuration Example 5

Figure 13:
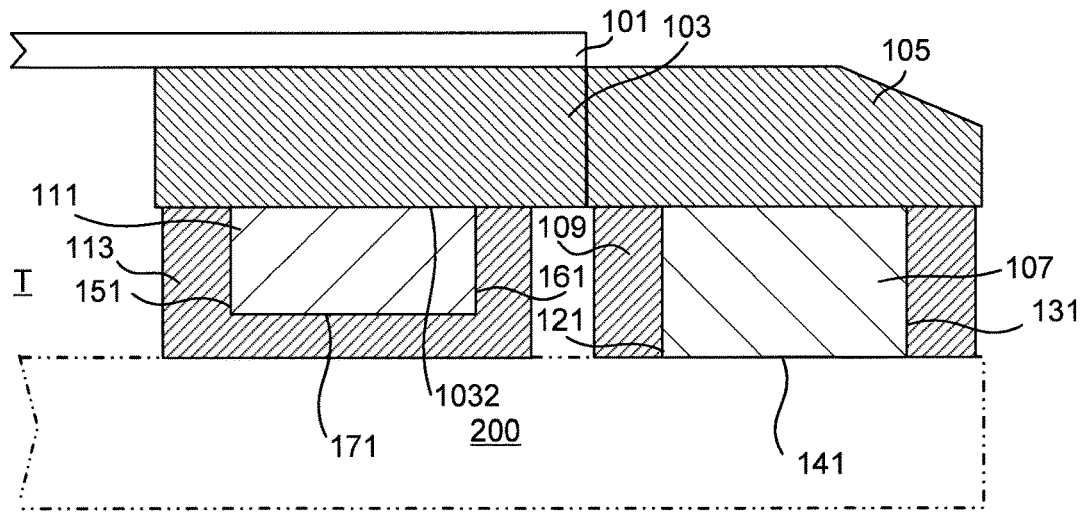
FIG. 13 is a cross-sectional view of a pellicle according to a configuration example 5 of an embodiment of the present invention.

FIG. 13 is a cross-sectional view of the pellicle 100 cut along a plane including the pellicle film 101, the support frame 103, and the protrusion part 105 (A-A cross-sectional view in FIG. 1). The configuration example 5 is substantially equivalent to a configuration in which the configuration example 2 and the configuration example 4 are combined. That is, the First inorganic material layer 109 covers the first side surface 121 and the second side surface 131 of the first adhesive layer 107. The Second inorganic material layer 113 is arranged on the third side surface 151, the fourth side surface 161, and second end surface 171 of the filling layer 111. The Second inorganic material layer 113 covers, for example, the entirety of the third side surface 151, the fourth side surface 161, and the second end surface 171.

Figure 14:
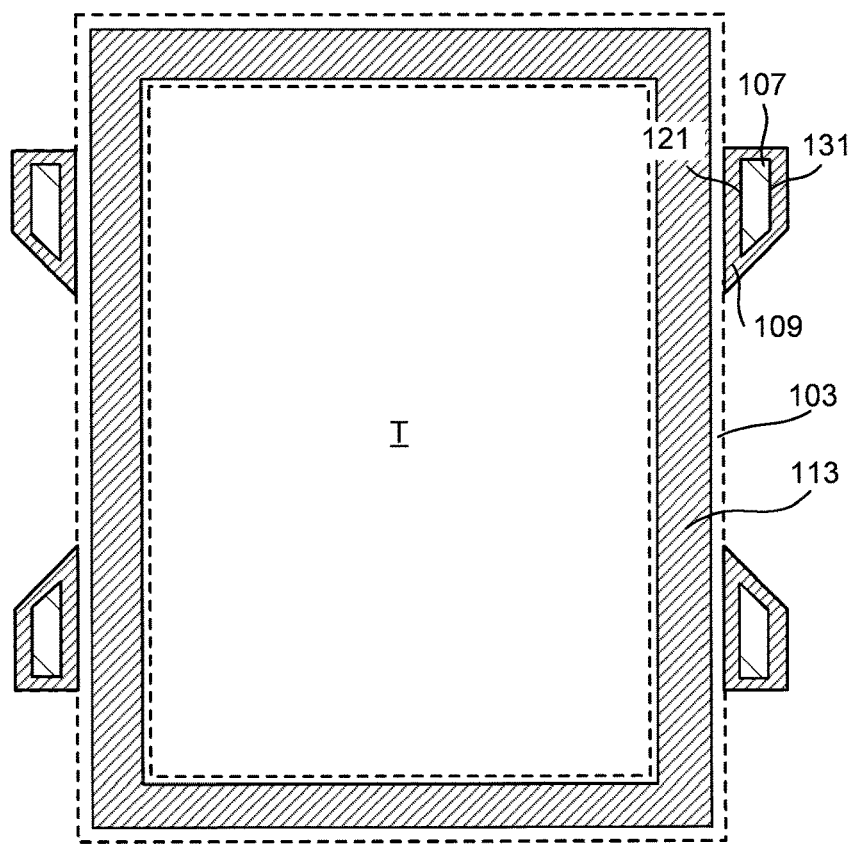
FIG. 14 is a view from below of a pellicle according to a configuration example 5 of an embodiment of the present invention.

FIG. 14 is a view from below of the pellicle 100 of the configuration of FIG. 13. In FIG. 14, the support frame 103 and the protrusion part 105 are indicated by broken lines, and the pellicle film 101 is omitted. When the pellicle 100 is viewed from the mask 200, the second inorganic material layer 113 surrounds the region T. Thus, region T is a closed region closed by the filling layers 111 and the second inorganic material layer 113.

The pellicle 100 according to the configuration example 5 exhibits the effects of the pellicle 100 according to the configuration example 2 and the effects of the pellicle 100 according to the configuration example 4 described above.

Configuration Example 6

In order to increase the strength of the support frame of the pellicle 100, the support frame 103 of the pellicle 100 according to the embodiment 6 includes a first frame body 103A and a second frame body 115.

Figure 15:
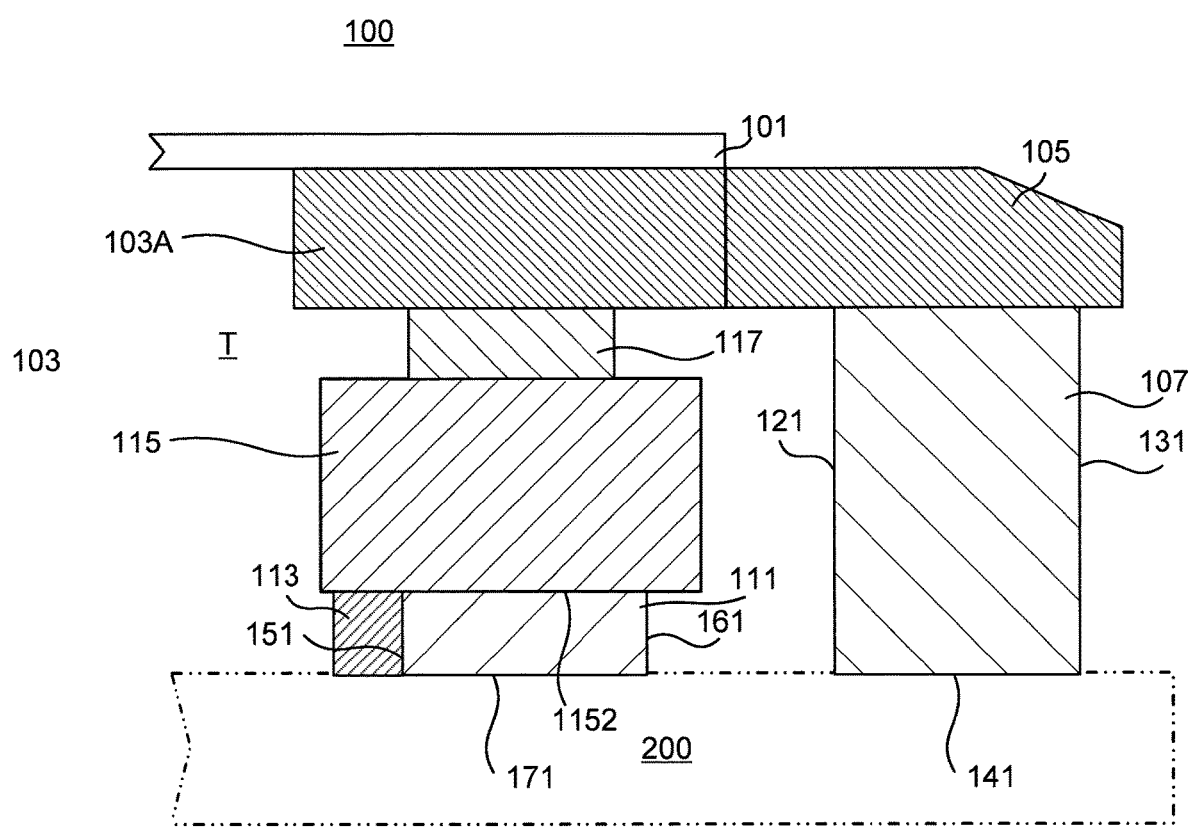
FIG. 15 is a cross-sectional view of a pellicle according to a configuration example 6 of an embodiment of the present invention.
Figure 16:
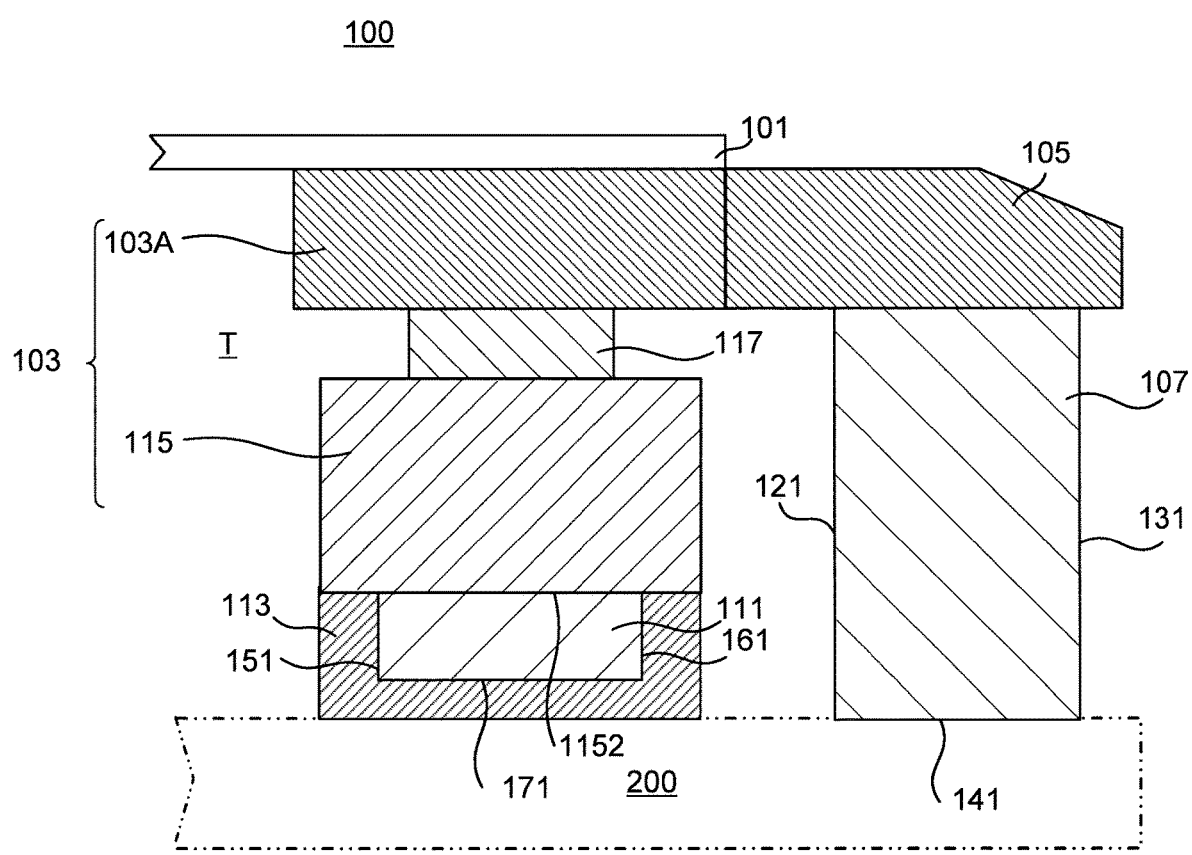
FIG. 16 is a cross-sectional view of a pellicle according to a configuration example 6 of an embodiment of the present invention.
Figure 17:
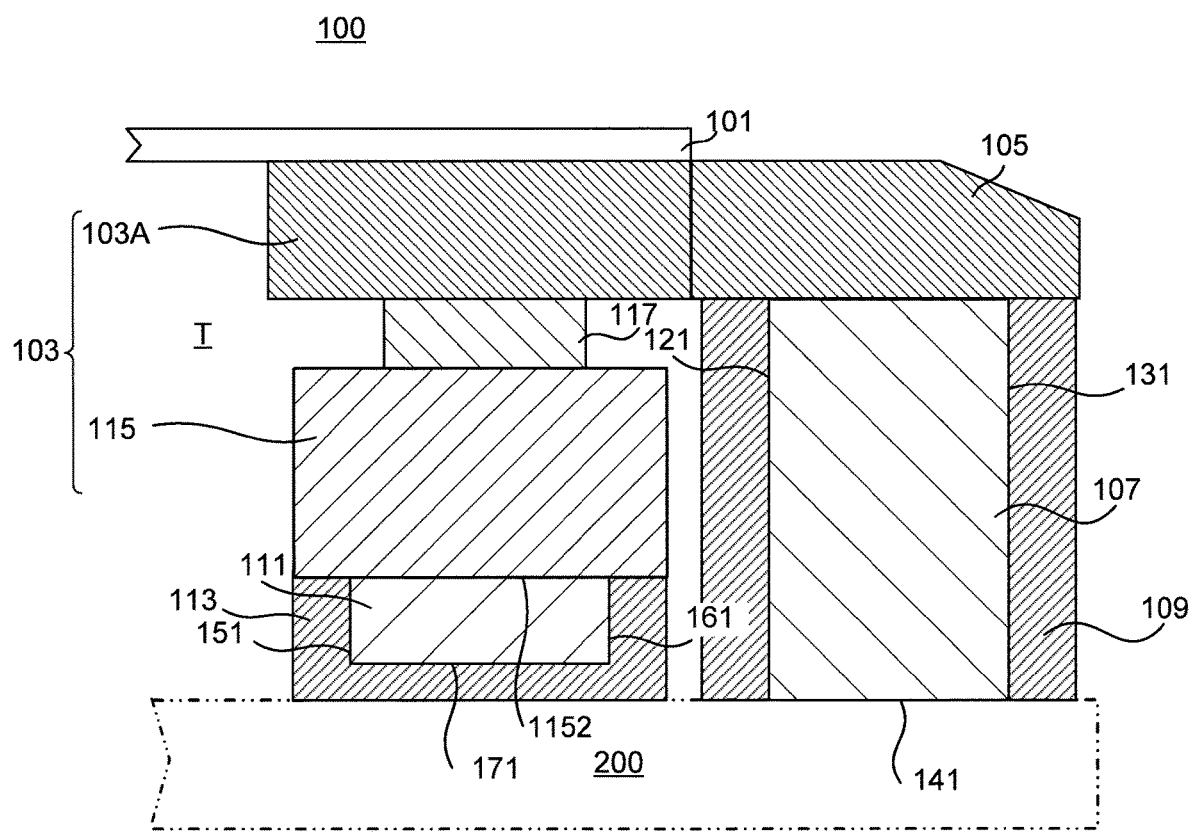
FIG. 17 is a cross-sectional view of a pellicle according to a configuration example 6 of an embodiment of the present invention.

FIG. 15 is a diagram showing a cross section of the pellicle 100 when the first frame body 103A and the second frame body 115 are applied to the support frame 103 of the configuration example 3. FIG. 16 is a diagram showing a cross section of the pellicle 100 when the first frame body 103A and the second frame body 115 are applied to the support frame 103 of the configuration example 4. FIG. 17 is a diagram showing a cross section of the pellicle 100 when the first frame body 103A and the second frame body 115 are applied to the support frame 103 of the configuration example 5.

The first frame body 103A is a frame body having the same configuration as each of the support frame 103 according to the configuration example 3 to the configuration example 5. The protrusion part 105 is formed integrally with the first frame body 103A. However, at least a part of the four protrusion parts 105 may be formed of a member different from the first frame body 103A, and, for example, may be connected to the first frame body 103A by, adhesion. The material of the first frame body 103A is not particularly limited, but, for example, silicon, sapphire, or silicon carbide is preferable, and silicon is more preferable. The second frame body 115 has a shape corresponding to the shape of the first frame body 103A. Specifically, the second frame body 115 is formed in a rectangular frame body to overlap with the first frame body 103A when viewed from the mask 200. That is, the second frame body 115 is arranged closer to the pellicle film 101 than the first adhesive layer 107.

The second frame body 115 is connected to the first frame body 103A through a second adhesive layer 117. The material of the second frame body 115 is not particularly limited, but aluminum, aluminum alloys (5000 series, 6000 series, 7000 series, etc.) or silicone is preferable from the viewpoint of compatibility of lightness and strength. The second frame body 115 is, for example, thicker than the first frame body 103A. In other words, the length perpendicular to the film surface of the pellicle film 101 is longer in the second frame body 115 than in the first frame body 103A. The second adhesive layer 117 is an adhesive layer for connecting the first frame body 103A and the second frame body 115. The adhesive of the second adhesive layer 117 may be the same adhesion as the first adhesive layer 107, or may be a different adhesion.

From the viewpoint of suppressing the generation of the outgas from the second adhesive layer 117 when the second adhesive layer 117 is irradiated with the EUV light, it is preferable that the inorganic material layer is also arranged on a side surface of the second adhesive layer 117. However, the second adhesive layer 117 is far from the mask 200, and the EUV light scattered on the surface of the mask 200 tends to be blocked by the second frame body 115. Therefore, it is not essential to arrange the inorganic material layer on the side surface of the second adhesive layer 117. The side surface of the second frame body 115 may also be arranged with the inorganic material layer.

As shown in FIGS. 15, 16, and 17, the filling layers 111 and the second inorganic material layer 113 are arranged on the second frame body 115. More specifically, the filling layers 111 and the second inorganic material layer 113 are arranged along a bottom surface 1152 of the second frame body 115. Therefore, the filling layers 111 and the second inorganic material layer 113 close the region T. Therefore, according to the pellicle 100 shown in FIGS. 15, 16, and 17, effects equivalent to those of the configuration example 3, the configuration example 4, and the configuration example 5 are obtained. Further, by etching the above mentioned substrate in a frame shape to make the remaining frame body as the first frame body 103A and connecting the second frame body 115, the support frame 103 becomes lighter and the strength of the support frame 103 is further improved while the handling at the time of manufacturing the pellicle film 101 is simplified.

Configuration Example 7

Figure 18:
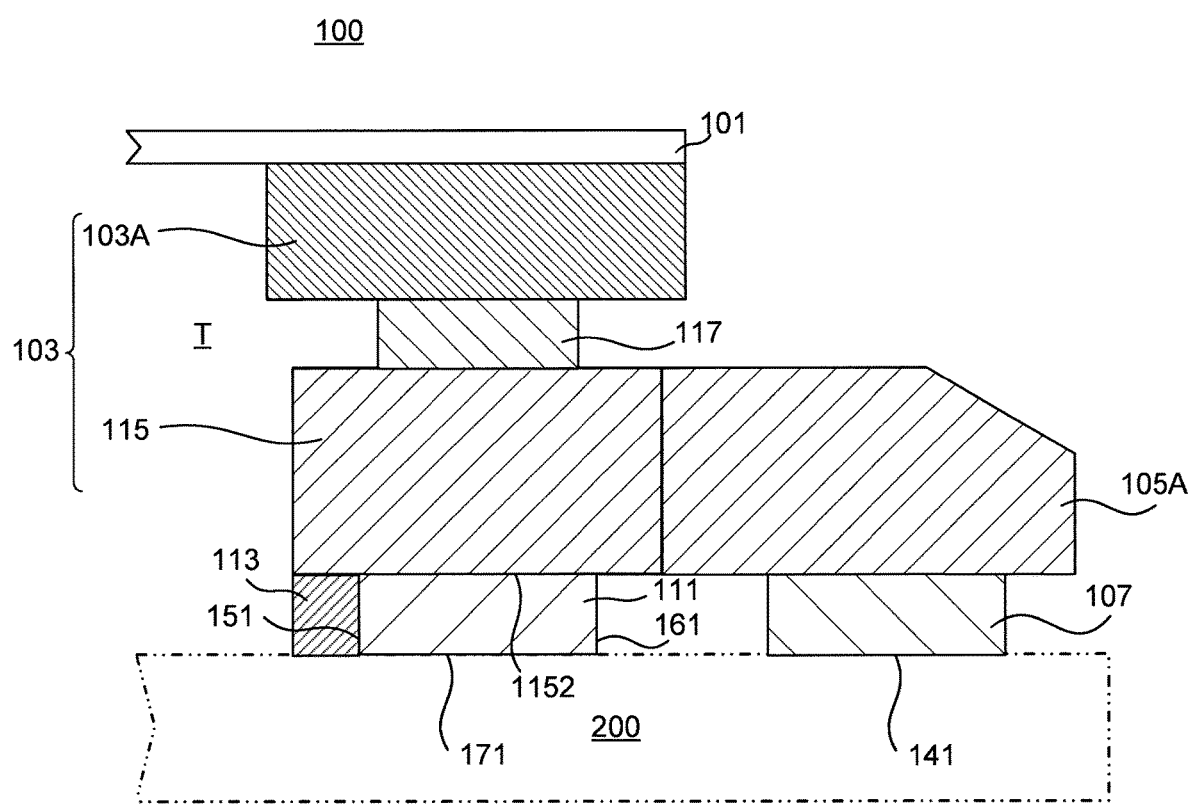
FIG. 18 is a cross-sectional view of a pellicle according to a configuration example 7 of an embodiment of the present invention.
Figure 19:
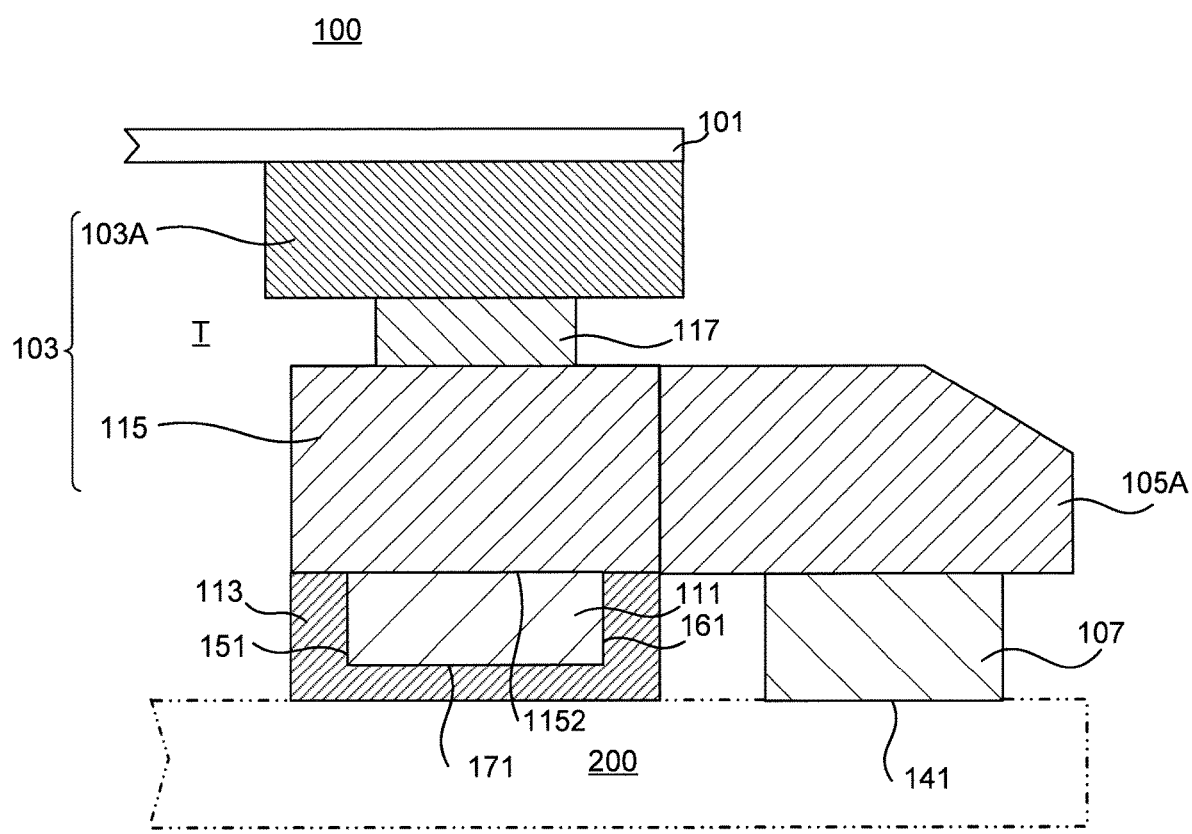
FIG. 19 is a cross-sectional view of a pellicle according to a configuration example 7 of an embodiment of the present invention.
Figure 20:
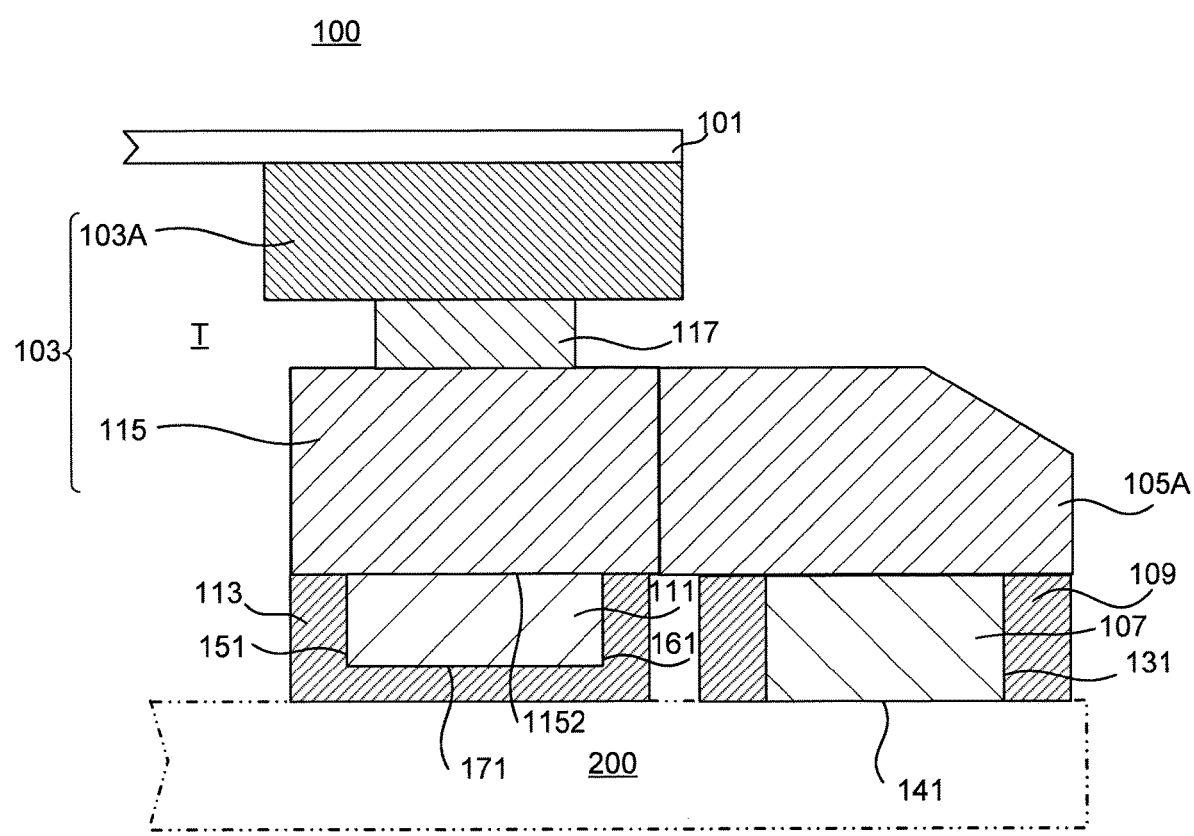
FIG. 20 is a cross-sectional view of a pellicle according to a configuration example 7 of an embodiment of the present invention.

In the pellicle 100 according to the configuration example 7, the protrusion part is arranged on the second frame body 115. FIGS. 18 to 20 are diagrams showing a cross section of the pellicle 100 when the protrusion part 105A is applied to the second frame body 115. In the example shown in FIG. 18, the first adhesive layer 107, the filling layers 111, and the second inorganic material layer 113 are arranged at the same position as in the configuration example 3. In the example shown in FIG. 19, the filling layers 111 and the second inorganic material layer 113 are arranged at the same position as in the configuration example 4. In the example shown in FIG. 20, the first adhesive layer 107, the first inorganic material layer 109, the filling layer 111, and the second inorganic material layer 113 are arranged at the same position as in the configuration example 5.

The protrusion part 105A is a portion which protrudes from the second frame body 115. Specifically, the protrusion part 105A protrudes from the support frame 103 on the region opposed to the region on which the pellicle film 101 is located. The protrusion part 105 A is connected to the mask 200 through the first adhesive layer 107. The protrusion part 105A is integrally formed with the second frame body 115. However, at least a part of the four protrusion parts 105A may be formed of a member different from the second frame body 115, and, for example, may be connected to the second frame body 115 by adhesion.

The pellicle 100 according to the configuration example 7, the same effect as that of the configuration example 6 can be obtained. In addition, since the thickness of the first adhesive layer 107 can be reduced as compared with the configuration example 6, the generation of the outgas tends to be further suppressed.

Note that the shapes, dimensions, and materials of the each member described in the configuration examples 1 to 7 are only examples, and various modifications are possible.

Figure 21:
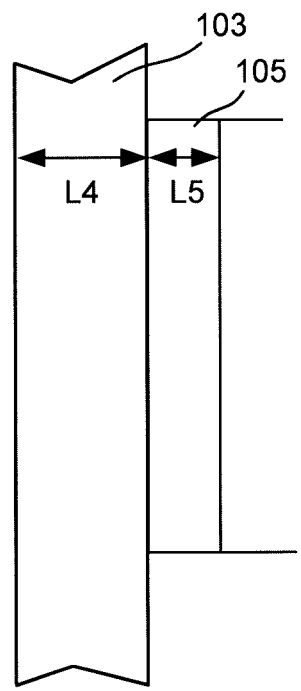
FIG. 21 is a diagram illustrating a configuration of a protrusion part according to a modification example of the present invention.

For example, in the pellicle 100, the protrusion part 105 may have a shape other than a trapezoidal shape in a top view. FIG. 21 is a diagram illustrating a configuration of the protrusion part 105 according to a modification. In this example, the protrusion part 105 has a rectangular top surface. The area of the protrusion part 105 is, for example, 30 $mm^2$ or more 250 $mm^2$ or less. The length L5 of a part corresponding to the short side of the protrusion part 105 is, for example, 1.5 mm or more and 20 mm or less. The protrusion part 105 may have a shape other than a trapezoidal, for example, a polygon shape other than a rectangle, a circle, or combinations thereof. The number of the protrusion parts 105 included in the support frame 103 is not limited to four, and may be two or more. The number of the protrusion parts 105 can be, for example, 2 or more and 10 or less. When the number of the protrusion parts 105 is large, the fixation between the pellicles 100 and the mask 200 tends to be sufficient, and when the number of the protrusion parts 105 is small, the generation of the outgas tends to be more suppressed. The protrusion part 105A can be modified in shapes, dimensions, and numbers in the same manner as the protrusion part 105.

The Exposure Master Plate

The exposure device of the present embodiment includes the exposure master plate of the present embodiment. Therefore, the same effects as those of the exposure master plate of the present embodiment can be obtained.

The exposure device of the present embodiment preferably comprises a light source for emitting the exposure light (preferably the EUV light or the like, more preferably the EUV light; the same shall apply hereinafter), the exposure master plate of the present embodiment, and an optical system for guiding the exposure light emitted from the light source to the exposure master plate, and the exposure master plate is arranged so that the exposure light emitted from the light source transmits the pellicle and irradiates to the exposure master plate.

According to this aspect, in addition to being able to form a pattern miniaturized by the EUV light or the like (e.g., line width of 32 nm or less), it is possible to perform the pattern exposure with reduced poor resolution due to the foreign matter, even when using the EUV light which is problematic of poor resolution due to the foreign matter.

The Exposure Device

Figure 22:
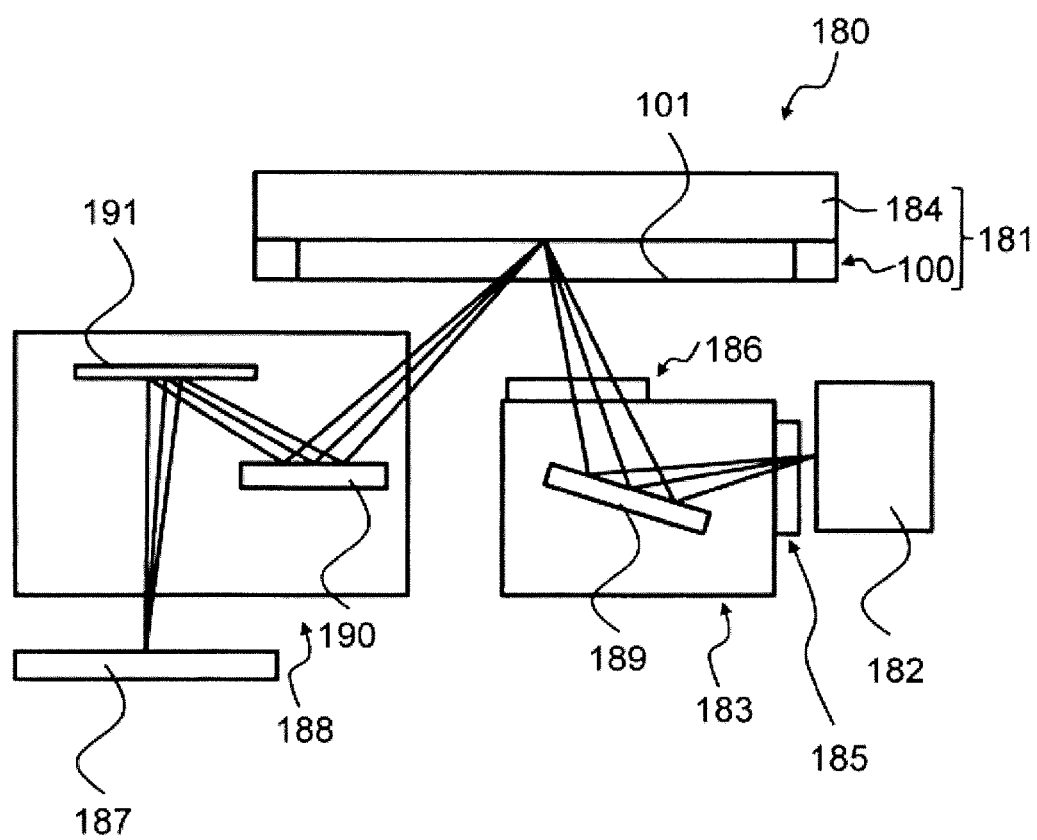
FIG. 22 is a schematic diagram of an exposure device according to an embodiment of the present invention.

FIG. 22 is a schematic cross-sectional view of an EUV exposure device 180, which is an exemplary exposure device of this embodiment.

As shown in FIG. 22, the EUV exposure device 180 comprises a light source 182 that emits the EUV light, an exposure master plate 181 which is an example of the exposure master plate of the present embodiment, and a lighting optical system 183 that directs the EUV light emitted from the light source 182 to the exposure master plate 181. In the EUV exposure device 180, the EUV light emitted from the light source 182 is condensed by the lighting optical system 183 to uniformize the illuminance, and is irradiated to the exposure master plate 181. The EUV light irradiated on the exposure master plate 181 is reflected in a pattern by a master plate (mask) 184.

The exposure master plate 181 is an example of the exposure master plate of the present embodiment. That is, the exposure master plate 181 includes the pellicle 100 which is an example of the pellicle of the present embodiment including the pellicle film 101 and the support frame; and the master plate 184. The exposure master plate 181 is arranged so that the EUV light emitted from the light source 182 is transmitted through the pellicle film 101 and irradiated to the master plate 184.

The lighting optical system 183 includes a plurality of multilayer film mirrors 189 and an optical coupler (optical integrators) and so on for adjusting the optical path of the EUV light.

The light source 182 and the lighting optical system 183 can use the known light source and the lighting optical system.

In the EUV exposure device 180, filter windows 185 and 186 are installed between the light source 182 and the lighting optical system 183 and between the lighting optical system 183 and the master plate 184, respectively. The filter windows 185 and 186 are capable of capturing scattered particles (debris). The EUV exposure device 180 also includes a projection optical system 188 that directs the EUV-light reflected by the master plate 184 to a sensitive substrate 187. In the EUV exposure device 180, the EUV light reflected by the master plate 184 is directed via the projection optical system 188 onto the sensitive substrate 187 and the sensitive substrate 187 is exposed in a pattern form. The exposure by EUV is performed under the condition of reduced pressure. The projection optical system 188 includes a plurality of multilayer film mirrors 190, 191, and the like. The filter window 185, the filter window 186 and the projection optical system 188 can use a known projection optical system.

The sensitive substrate 187 is made of a substrate or the like in which a resist is coated on the semiconductor wafer, and the resist is cured as having a shape of a pattern by the EUV-light reflected by the master plate 184. By developing this resist and etching the semiconductor wafer, a desired pattern is formed on the semiconductor wafer.

Manufacturing Method of Semiconductor Device

The method of manufacturing the semiconductor device of the present embodiment comprises transmitting the exposure light emitted from the light source through the pellicle of the exposure master plate and irradiating the exposure light to the master plate, and reflecting the exposure light on the master plate, and transmitting the exposure light reflected by the master plate through the pellicle firm, irradiating the exposure light on the sensitive substrate, and thereby exposing the sensitive substrate in patterned shape.

According to the method of manufacturing the semiconductor device of the present embodiment, it is possible to produce the semiconductor device with reduced poor resolution due to the foreign matter, even when using the EUV light which is a problem of poor resolution due to the foreign matter.

The method of manufacturing the pellicle film in preferred embodiments according to the present invention has been described above. However, these are merely examples, and the technical scope of the present invention is not limited thereto. Indeed, various modifications may be made by those skilled in the art without departing from the substance of the present invention as defined by the claims. Therefore, these modifications are to be duly interpreted as being encompassed in the technological scope of the present invention.

According to the present invention, it is possible to provide a pellicle in which outgas from adhesive layer is suppressed.

What is claimed is:

1. A pellicle comprising:
a pellicle film;
a support frame for supporting the pellicle film;
a protrusion part arranged in the support frame;
a first adhesive layer arranged on the protrusion part; and
an inorganic material layer arranged at a position closer to the pellicle film than the first adhesive layer,
wherein the inorganic material layer has a thickness of 50 nm or more and 1 μm or less in a direction parallel to a film surface of the pellicle film.

2. The pellicle according to claim 1, wherein the inorganic material layer comprises a first inorganic material layer arranged at a first side surface of the first adhesive layer, at a direction intersecting the pellicle film, and arranged at a position closer to the pellicle film than the first adhesive layer.

3. The pellicle according to claim 2, wherein the first inorganic material layer is further arranged at a second side surface of the first adhesive layer opposing the first side surface.

4. The pellicle according to claim 2, wherein the first inorganic material layer is further arranged at a first end surface of the first adhesive layer opposing a surface in contact with the protrusion part.

5. The pellicle according to claim 2, further comprising:
a filling layer arranged in the support frame, wherein the inorganic material layer comprises a second inorganic material layer instead of the first inorganic material layer or in addition to the first inorganic material layer, the second inorganic material layer arranged at a third side surface of the filling layer, the third side surface of the filling layer at a direction intersecting the pellicle film, and arranged in an area where the pellicle film is arranged.

6. The pellicle according to claim 5, wherein the second inorganic material layer and the filling layer are formed in a frame shape along a bottom surface of the support frame.

7. The pellicle according to claim 6, wherein the second inorganic material layer is further arranged at a fourth side surface of the filling layer opposing the third side surface, and a second end surface of the filling layer opposing a surface in contact with the support frame.

8. The pellicle according to claim 1, wherein the support frame comprises a first frame body connected with pellicle film, and a second frame body connected with the first frame body.

9. The pellicle according to claim 1, wherein the inorganic material layer is a metal layer.

10. The pellicle according to claim 9, wherein the metal layer is made from a metal selected from a group of aluminum, titanium, iron, nickel, copper, ruthenium, titanium and gold, an alloy including at least two elements selected from the group, or an oxide including at least one or more elements selected from the group.

11. The pellicle according to claim 1, wherein the first adhesive layer has a thickness of 10 μm or more and 1 mm or less in a direction perpendicular to the film surface of the pellicle film.

12. The pellicle according to claim 1, wherein the inorganic material layer has a transmittance of a EUV light of 10% or less when the EUV light is irradiated to the inorganic material layer having a thickness of 400 nm.

13. The pellicle according to claim 1, wherein a first end surface of the first adhesive layer opposed to a surface on which the first adhesive layer contacts the protrusion part is exposed from the inorganic material layer.

14. An exposure master plate comprising:
a master plate;
the pellicle according to claim 1, the pellicle attached to a surface of the master plate with a pattern.

15. An exposure device comprising:
the exposure master plate according to claim 14.

16. An exposure device comprising:
a light source for emitting an exposure light;
the exposure master plate according to claim 14; and
an optical system for guiding the exposure light emitted from the light source to the exposure master plate,
wherein the exposure master plate is arranged so that the exposure light emitted from the light source transmits the pellicle film and irradiates to the exposure master plate.

17. The exposure device according to claim 16, wherein the exposure light is an Extreme Ultraviolet light.

18. A method of manufacturing a semiconductor device, comprising steps of:
transmitting an exposure light emitted from a light source through the pellicle film of the exposure master plate according to claim 14, irradiate the exposure light to the master plate, and reflecting the exposure light on the master plate; and
transmitting the exposure light reflected by the master plate through the pellicle film, irradiating the exposure light on a sensitive substrate, and thereby exposing the sensitive substrate in patterned shape.

* * * * *